US012785697B2

(12) United States Patent
Zhang et al.

(10) Patent No.: US 12,785,697 B2
(45) Date of Patent: Nov. 3, 2026

(54) DELAY MEASUREMENT CIRCUIT AND MEMORY

(71) Applicant: CXMT Corporation, Hefei City (CN)

(72) Inventors: Jiapeng Zhang, Hefei City (CN); Yoonjoo Eom, Hefei City (CN); Jaehun Jung, Hefei City (CN)

(73) Assignee: CXMT Corporation, Hefei City (CN)

( * ) Notice: Subject to any disclaimer, the term of this patent is extended or adjusted under 35 U.S.C. 154(b) by 110 days.

(21) Appl. No.: 19/012,791

(22) Filed: Jan. 7, 2025

(65) Prior Publication Data

US 2025/0392315 A1 Dec. 25, 2025

Related U.S. Application Data

(63) Continuation of application No. PCT/CN2024/127590, filed on Oct. 28, 2024.

(30) Foreign Application Priority Data

Jun. 24, 2024 (CN) ......................... 202410826730.0

(51) Int. Cl.
*H03L 7/081* (2006.01)
*G11C 11/4076* (2006.01)

(52) U.S. Cl.
CPC ........ *H03L 7/0818* (2013.01); *G11C 11/4076* (2013.01)

(58) Field of Classification Search
CPC ......... H03L 7/0818; H03L 7/081; H03L 7/18; G11C 11/4076; G11C 7/22; G11C 29/50
USPC ........................................................ 365/233.1
See application file for complete search history.

(56) References Cited

U.S. PATENT DOCUMENTS

| | | | | |
|---|---|---|---|---|
| 2013/0214833 | A1 * | 8/2013 | Kim | G11C 7/22 327/156 |
| 2014/0293719 | A1 | 10/2014 | Jung | |
| 2017/0125076 | A1 * | 5/2017 | Jung | G11C 11/4072 |
| 2019/0074841 | A1 | 3/2019 | Satoh | |
| 2019/0147927 | A1 * | 5/2019 | Jeon | H03L 7/0812 365/194 |

OTHER PUBLICATIONS

International Search Report and written opinion in application No. PCT/CN2024/127590, mailed on Mar. 1, 2025.

* cited by examiner

*Primary Examiner* — Fernando Hidalgo
(74) *Attorney, Agent, or Firm* — Syncoda LLC; Feng Ma

(57) ABSTRACT

A delay measurement circuit includes: a loop flag generation circuit configured to: generate a loop flag signal and input the loop flag signal to the loop of the delay-locked loop when loop delay measurement is performed on the delay-locked loop; and generate a measurement finish signal and generate a target pulse signal after the loop flag signal is cycled for M times in the loop of the delay-locked loop, a valid pulse width of the target pulse signal being equal to M times a loop delay; and a counter circuit configured to: receive a divided clock signal; time the valid pulse width of the target pulse signal based on the divided clock signal, to obtain a timing result; and perform preset processing on the timing result, to obtain a loop delay measurement result of the delay-locked loop.

15 Claims, 10 Drawing Sheets

DELAY MEASUREMENT CIRCUIT AND MEMORY

CROSS-REFERENCE TO RELATED APPLICATIONS

This application is a continuation of International Patent Application No. PCT/CN2024/127590, filed on Oct. 28, 2024, which claims priority to Chinese Patent Application No. 202410826730.0, filed on Jun. 24, 2024. The disclosures of the above-referenced applications are hereby incorporated by reference in their entirety.

BACKGROUND

In a storage system, data is usually transmitted in specific timing. Normal working of a memory depends on that internal commands and clocks can have accurate timing. For example, when the memory receives a read command, the memory needs to output data from a data port after an expected delay time. When the memory receives a write command, the memory also needs to receive data from the data port after an expected delay time. In this case, the memory needs to be able to accurately measure and calculate a path delay of a command signal and a clock signal, so that the timing can be accurately controlled. However, as a working frequency of the memory increases, it is likely to pose a challenge to measurement of the path delay.

SUMMARY

Embodiments of the present disclosure relate to the field of semiconductor technologies, and in particular, to a delay measurement circuit and a memory.

Embodiments of the present disclosure provide a delay measurement circuit and a memory, to at least help to increase a margin of the delay measurement circuit and improve accuracy of loop delay measurement.

According to a first aspect, an embodiment of the present disclosure provides a delay measurement circuit, applied to a delay-locked loop, and including:

- a loop flag generation circuit, electrically connected to a loop of the delay-locked loop, and configured to: generate a loop flag signal and input the loop flag signal to the loop of the delay-locked loop when loop delay measurement is performed on the delay-locked loop; and generate a measurement finish signal and generate a target pulse signal after the loop flag signal is cycled for M times in the loop of the delay-locked loop, a valid pulse width of the target pulse signal being equal to M times a loop delay, and M being an even number greater than 1; and
- a counter circuit, electrically connected to the loop flag generation circuit, and configured to: receive a divided clock signal; time the valid pulse width of the target pulse signal based on the divided clock signal, to obtain a timing result; and perform preset processing on the timing result, to obtain a loop delay measurement result of the delay-locked loop.

In some embodiments, the delay measurement circuit further includes:

- a control circuit, configured to: generate a measurement control signal of a first level when loop delay measurement is performed on the delay-locked loop, and generate a measurement control signal of a second level at a remaining moment.

In some embodiments, the delay measurement circuit further includes:

- a selection circuit, electrically connected to the loop of the delay-locked loop, and configured to: choose to input the loop flag signal to the loop of the delay-locked loop when loop delay measurement is performed on the delay-locked loop; and input a reference clock signal to the loop of the delay-locked loop at a remaining moment.

In some embodiments, the loop flag generation circuit includes:

- an initial flag generation circuit, configured to generate an initial loop flag signal after waiting for a preset cycle, in response to that the measurement control signal changes from the second level to the first level, the preset cycle being a first value when a working frequency of the delay-locked loop is greater than a preset frequency; the preset cycle being a second value when the working frequency of the delay-locked loop is less than or equal to the preset frequency; and the first value being greater than the second value; and
- a logic processing circuit, electrically connected to the loop of the delay-locked loop, and configured to: receive a signal through a feedback terminal of the loop, perform inversion processing on the signal, and perform AND logic processing on a signal obtained after the inversion processing and the initial loop flag signal, to generate the loop flag signal.

In some embodiments, the loop flag generation circuit further includes:

- a target pulse generation circuit, configured to: count a change edge of the loop flag signal, start to generate a valid pulse of the target pulse signal in response to the 1st change edge of the loop flag signal, finish the valid pulse of the target pulse signal in response to the (M+1)th change edge of the loop flag signal, and generate the measurement finish signal in response to that the valid pulse of the target pulse signal is finished.

In some embodiments, the initial flag generation circuit includes:

- a first selector, configured to: receive a frequency representation signal, a first divided clock signal, and a second divided clock signal; select the first divided clock signal and output the first divided clock signal as a timing clock signal when the frequency representation signal indicates that the working frequency of the delay-locked loop is greater than the preset frequency; select the second divided clock signal and output the second divided clock signal as the timing clock signal when the frequency representation signal indicates that the working frequency of the delay-locked loop is less than or equal to the preset frequency, a frequency of the second divided clock signal being higher than a frequency of the first divided clock signal; and
- A cascaded first flip-flops, configured to: receive the timing clock signal at a clock terminal of each of the first flip-flops, receive the measurement control signal at a data terminal of the first flip-flop at a first stage, a data terminal of each of the first flip-flops after the first stage being connected to an output terminal of a first flip-flop at a previous stage, and output the initial loop flag signal at an output terminal of the first flip-flop at a last stage, A being an integer greater than 1.

In some embodiments, the delay measurement circuit further includes:

- a frequency divider, configured to: receive a reference clock signal, and perform frequency division processing on the reference clock signal, to generate multiple divided clock signals, the multiple divided clock signals including at least the first divided clock signal and the second divided clock signal.

In some embodiments, the frequency divider includes:

a second flip-flop, a clock terminal of the second flip-flop receiving the reference clock signal, and a data terminal of the second flip-flop being connected to an inverting output terminal of the second flip-flop;

a third flip-flop, a clock terminal of the third flip-flop being connected to the output terminal of the second flip-flop, a data terminal of the third flip-flop being connected to an inverting output terminal of the third flip-flop, an output terminal of the third flip-flop outputting the second divided clock signal, and a clock cycle of the second divided clock signal being four times a clock cycle of the reference clock signal; and a fourth flip-flop, a clock terminal of the fourth flip-flop being connected to the output terminal of the third flip-flop, a data terminal of the fourth flip-flop being connected to an inverting output terminal of the fourth flip-flop, an output terminal of the fourth flip-flop outputting the first divided clock signal, and a clock cycle of the first divided clock signal being eight times the clock cycle of the reference clock signal.

In some embodiments, the target pulse generation circuit includes:

a fifth flip-flop, a clock terminal of the fifth flip-flop receiving the loop flag signal, and a data terminal of the fifth flip-flop being connected to an inverting output terminal of the fifth flip-flop;

a sixth flip-flop, a clock terminal of the sixth flip-flop being connected to the output terminal of the fifth flip-flop, a data terminal of the sixth flip-flop being connected to an inverting output terminal of the sixth flip-flop, and the output terminal of the sixth flip-flop outputting the target pulse signal; and a seventh flip-flop, a clock terminal of the seventh flip-flop receiving an inverted signal of the target pulse signal, a data terminal of the seventh flip-flop receiving a power signal, and an output terminal of the seventh flip-flop outputting the measurement finish signal;

M being equal to 4.

In some embodiments, the control circuit receives a lock flag signal and the measurement finish signal, generates the measurement control signal of the first level in response to the lock flag signal, and generates the measurement control signal of the second level in response to the measurement finish signal, and the lock flag signal represents that phase locking of the delay-locked loop is completed.

In some embodiments, the control circuit includes:

an eighth flip-flop, a clock terminal of the eighth flip-flop receiving a reference clock signal, a data terminal of the eighth flip-flop receiving the lock flag signal, an output terminal of the eighth flip-flop outputting the measurement control signal, and a reset terminal of the eighth flip-flop receiving the measurement finish signal.

In some embodiments, the counter circuit includes:

a delay adjustment circuit, configured to: receive the divided clock signal, and delay the divided clock signal by first adjustment duration, to generate an adjusted divided clock signal, the first adjustment duration being utilized to match a physical delay required for generating the target pulse signal by the loop flag generation circuit;

a gating circuit, configured to: receive the adjusted divided clock signal and the target pulse signal, and perform gating processing on the adjusted divided clock signal based on the target pulse signal, to generate a counting clock signal; and a binary counter, configured to count a clock pulse of the counting clock signal, to generate a binary timing result.

In some embodiments, the preset processing includes: performing shift processing on the binary timing result based on a frequency of the divided clock signal and a value of M, to obtain the loop delay measurement result.

In some embodiments, a difference between a time in which the loop flag signal is cycled for one time in the loop of the delay-locked loop and a time in which the reference clock signal is cycled for one time in the loop of the delay-locked loop is less than a first preset value.

According to a second aspect, an embodiment of the present disclosure provides a memory. The memory includes at least the delay measurement circuit according to the first aspect.

The technical solutions provided in the embodiments of the present disclosure have at least the following advantages:

A delay measurement circuit is applied to a delay-locked loop and includes: a loop flag generation circuit, electrically connected to a loop of the delay-locked loop, and configured to: generate a loop flag signal and input the loop flag signal to the loop of the delay-locked loop when loop delay measurement is performed on the delay-locked loop; and generate a measurement finish signal and generate a target pulse signal after the loop flag signal is cycled for M times in the loop of the delay-locked loop, a valid pulse width of the target pulse signal being equal to M times a loop delay, and M being an even number greater than 1; and a counter circuit, electrically connected to the loop flag generation circuit, and configured to: receive a divided clock signal; time the valid pulse width of the target pulse signal based on the divided clock signal, to obtain a timing result; and perform preset processing on the timing result, to obtain a loop delay measurement result of the delay-locked loop. In this solution, the loop flag signal is input to the loop of the delay-locked loop, and is cycled for M cycles, to obtain M times the loop delay, which is reflected by the valid pulse width of the target pulse signal, and the M times the loop delay is timed based on the divided clock signal. In this way, the delay measurement circuit has a larger measurement margin, avoiding a loop delay measurement error occurring due to an insufficient margin at a high clock frequency, and improving accuracy of loop delay measurement.

BRIEF DESCRIPTION OF THE DRAWINGS

One or more embodiments are exemplified with the figures in the accompanying drawings corresponding to the one or more embodiments. These example descriptions are not intended to limit the embodiments. Elements with the same reference numerals in the accompanying drawings are similar elements, and unless specifically stated, no scale limitations are constituted by the figures in the accompanying drawings. To describe the technical solutions in the embodiments of the present disclosure or the conventional technologies more clearly, the accompanying drawings required by the embodiments are briefly described below. Clearly, the accompanying drawings in the following description show merely some embodiments of the present disclosure, and other drawings may be obtained by a person of ordinary skill in the art from these accompanying drawings without creative efforts.

DETAILED DESCRIPTION

Figure 1:
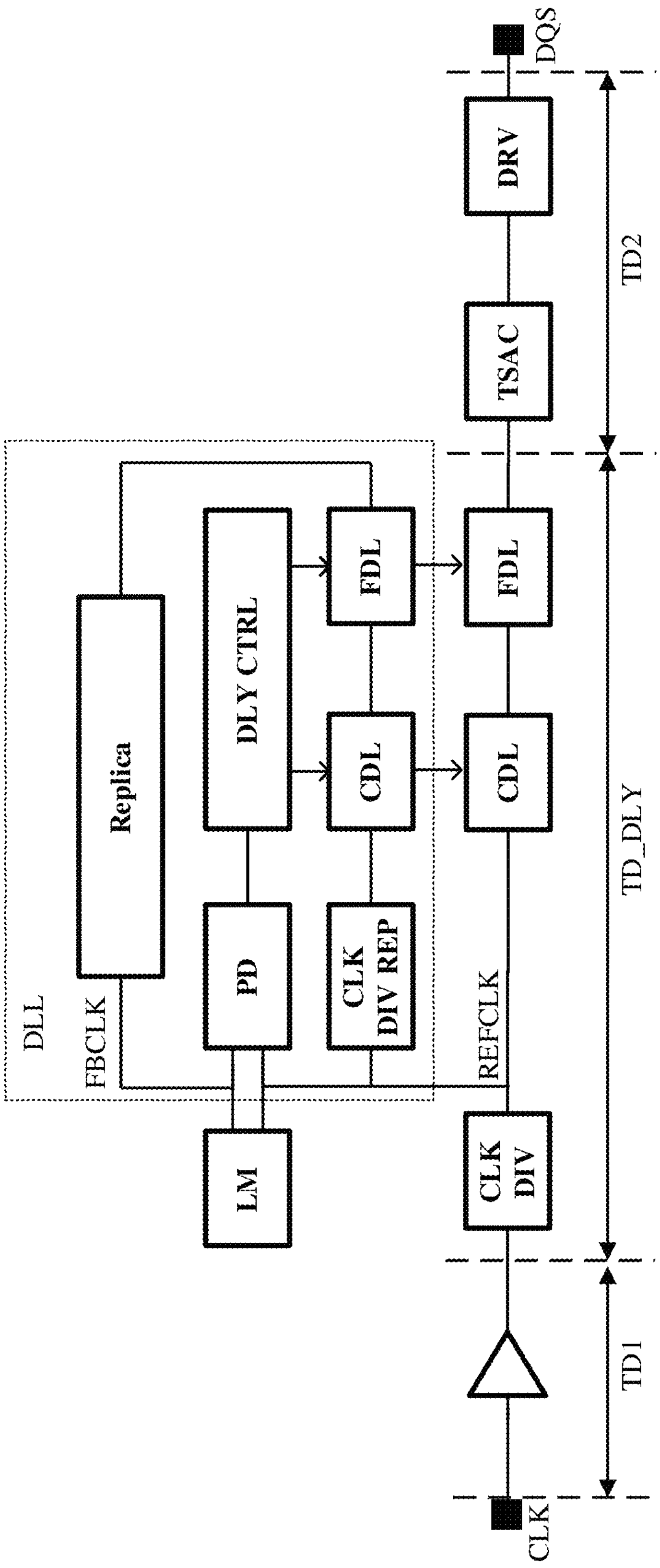
FIG. 1 is a schematic structural diagram of a delay-locked loop (DLL)

The technical solutions in the embodiments of the present disclosure are clearly described below with reference to the accompanying drawings in the embodiments of the present disclosure. It may be understood that specific embodiments described herein are merely intended to explain the related application, but are not intended to limit this application. In addition, it should be further noted that for ease of description, only parts related to the related application are shown in the accompanying drawings. Unless otherwise defined, all technical and scientific terms employed in this specification have meanings the same as those commonly understood by a person skilled in the technical field of the present disclosure. The terms employed in this specification are merely intended to describe the embodiments of the present disclosure, but are not intended to limit the present disclosure. The following descriptions relate to "some embodiments" describing a subset of all possible embodiments. However, it may be understood that "some embodiments" may be the same subset or different subsets of all the possible embodiments, and may be combined with each other when there is no conflict. It should be noted that the term "first\second\third" in the embodiments of the present disclosure is merely intended to distinguish between similar objects, and does not represent specific sorting for the objects. It may be understood that "first\second\third" may be interchanged for a specific sequence or order if allowed, so that the embodiments of the present disclosure described herein can be implemented in a sequence other than those shown or described herein.

Dynamic random access memory (DRAM);

synchronous dynamic random access memory (SDRAM);

double data rate SDRAM (DDR);

low power DDR (LPDDR);

DDRn specification (DDRn), e.g., DDR3, DDR4, DDR5, or DDR6;

LPDDRn specification (LPDDRn), e.g., LPDDR3, LPDDR4, LPDDR5, or LPDDR6;

delay-locked loop (DLL);

loop delay measurement (Loop Measure, LM); and latency.

In a storage system, data is usually transmitted in specific timing. Normal working of a memory depends on that internal commands and clocks can have accurate timing. For example, when the memory receives a read command, the memory needs to output data from a data port after an expected delay time. When the memory receives a write command, the memory also needs to receive data from the data port after an expected delay time. In this case, the memory needs to be able to accurately measure and calculate a path delay of a command signal and a clock signal, so that the timing can be accurately controlled.

The expected delay time (Latency), which may also be referred to as "latency", is an important parameter defined in a DRAM design specification. The parameter is configured by a DRAM controller, and the parameter is stored in a DRAM register. The parameter specifies that after receiving a read or write command, a DRAM needs to send or receive data (DQ) and a data strobe signal (DQS) after a fixed time interval that is an integral multiple of a clock cycle. For example, if a read latency (RL) is set to 28, it indicates that after receiving the read command, the DRAM needs to send data (DQ) and a data strobe signal (DQS) after 28 clock cycles. The DRAM controller performs configuration, and there may be multiple settings of the RL. In the present disclosure, a clock cycle, denoted as tck, is a clock cycle of an external clock signal CK_t received by the DRAM. The latency is set to meet a timing constraint when a master machine and a slave machine communicate and to give the DRAM time for data preparation. In a process in which the DRAM and the master machine communicate, a latency error causes a communication failure, a data loss, or the like.

To establish a timing constraint, in the DRAM design specification, it is required that the latency needs to be an integral multiple of the clock cycle (N*tck, where N is a positive integer). However, in an actual circuit, because of a change of a process, a voltage, and a temperature, a delay of the actual circuit is full of uncertainty and is interfered by external noise. A designer needs to convert the delay of the actual circuit into a delay that is an integral multiple of the clock cycle, and such an operation is implemented through a delay-locked loop.

In the DRAM design field, a generated latency mainly includes an actual circuit delay and a shift register delay. Because of a change of an environment, a process, and a voltage, it is difficult to set an initial value of the actual circuit delay to a delay that is an integral multiple of the clock cycle. Because it is required in a design specification that the actual circuit delay needs to be converted into a delay that is an integral multiple of the clock cycle, such an operation is usually completed through a delay-locked loop (DLL).

FIG. 1 shows a structure of a delay-locked loop. An external clock signal CK_t is input from a clock port CLK, and a delay of an input path is denoted by TD1. Then, the external clock signal CK_t passes through a clock divider (CLK DIV), to generate a reference clock signal REFCLK, and then the reference clock signal REFCLK passes through a coarse delay line (CDL), a fine delay line (FDL), a clock distribution network (TSAC), and an output driver circuit (Driver, DRV), to output a DQS through a data strobe signal output port. A delay of the three parts of the CLK DIV, the CDL, and the FDL may be denoted by TD_DLY. A delay of the TSAC and the DRV is denoted as an output delay, and may be denoted by TD2. The DLL includes the coarse delay line (CDL), the fine delay line (FDL), and a clock divider replica (CLK DIV REP) configured to simulate a delay of the clock divider. The DLL further includes a replication circuit Replica, and is configured to simulate a delay of the input path, the clock distribution network (TSAC), and the output driver circuit (DRV). A delay of the replication circuit Replica is denoted by TD_REP. In an ideal case, a design objective is TD_REP=TD1+TD2. The reference clock signal REFCLK enters the DLL, and is cycled for one loop, to output a feedback clock signal FBCLK through an output terminal of the replication circuit Replica. A phase detector (PD) compares a phase of the reference clock signal REFCLK and a phase of the feedback clock signal FBCLK, and then a delay control (DLY CTRL) module controls a delay of the CDL and the FDL, so that a phase difference between a final reference clock signal REFCLK and a final feedback clock signal FBCLK is approximately 0, and the DLL reaches a locked state. In an ideal case, when the DLL is locked, a rising edge of the reference clock signal REFCLK and a rising edge of the feedback clock signal FBCLK are aligned, and a phase difference between the reference clock signal REFCLK and the feedback clock signal FBCLK is equal to 0. However, in an actual case, provided that the phase difference between REFCLK and FBCLK is approximately 0 within an error allowable range, it may be considered that the DLL reaches the locked state. A delay of the DLL is equal to the sum of the delay of the clock divider replica (CLK DIV REP), the CDL, and the FDL and the delay of the replication circuit Replica, that is, equal to TD_DLY+TD_REP. When the DLL is locked, the delay of the DLL is an integral multiple of a clock cycle (N*tck). In other words, TD_DLY+TD_REP is an integral multiple of the clock cycle (N*tck). A path delay of an actual circuit is a delay from an input to the CLK port to an output from the DQS port, and is equal to TD1+TD_DLY+TD2. When TD_REP=TD1+TD2 is designed, the path delay of the actual circuit is equal to TD_DLY+TD_REP, that is, equal to the delay of the DLL. Therefore, when the DLL is locked, the path delay of the actual circuit is also an integral multiple of the clock cycle (N*tck).

It should be understood that a limitation on the phase difference allows a specific error in the present disclosure. A subsequent related limitation on a phase value, a subsequent related limitation that signal edges are aligned, and a subsequent related limitation that signal waveforms are the same fall within the error allowable range.

In order for a DRAM to perform an operation such as data preparation, a latency needs to be greater than the path delay of the actual circuit, and a remaining delay may be implemented through a shift register based on a clock frequency. The latency, the path delay of the actual circuit, and a delay of the shift register are all measured in clock cycles. If a shift register based on the clock frequency at each stage is delayed by 1*tck, a quantity of stages of shift registers may be obtained based on (Latency−N). A value of N is measured by a loop delay measurement (Loop Measure, LM) module in the DLL.

Figure 2:
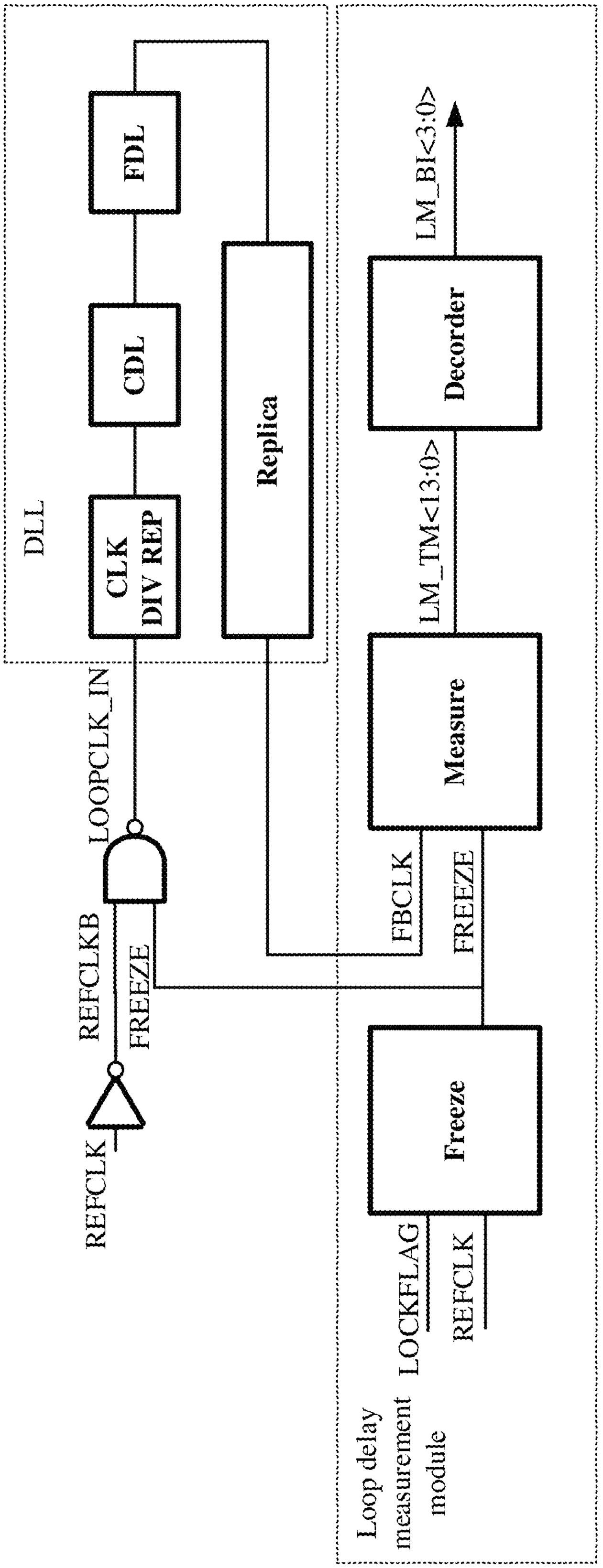
FIG. 2 is a schematic structural diagram of a delay measurement circuit.

Loop delay measurement is performed on the DLL on the premise that the DLL is locked. Only in this way, can it be ensured that the loop delay of the DLL is an integral multiple of the clock cycle. After the DLL is locked, a lock flag signal (LOCKFLAG) is sent to indicate to start to perform loop delay measurement. FIG. 2 shows a structure of a delay measurement circuit. A loop delay measurement module includes a freeze signal generation module Freeze, a measurement module Measure, and a decoder module Decoder. After sampling the lock flag signal LOCKFLAG, the freeze signal generation module generates a freeze signal FREEZE, to block the reference clock signal REFCLK from entering the DLL. A clock having entered the DLL before this moment is still output in FBCLK. In the measurement module Measure, cascaded D flip-flops are utilized for counting, and FBCLK is utilized as a clock input to the cascaded D flip-flops, to sample the FREEZE signal, so as to obtain a result LM_TM of a thermometer code. The result is converted by the decoder module into a binary code, to obtain the value of N, which is denoted by LM_BI. The value of N is sent to an operation module in the DRAM for calculation of (Latency−N), to obtain a required quantity of stages of shift registers.

Figure 3A:
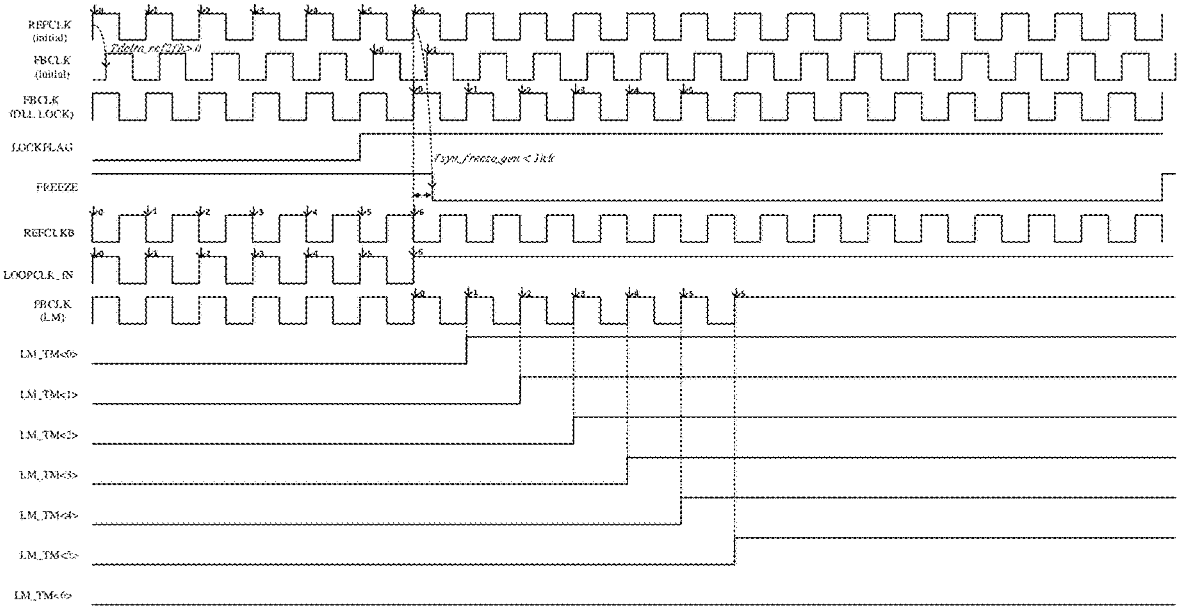
FIG. 3A is a signal waveform diagram of a delay measurement circuit in a case.

FIG. 3A is a signal waveform diagram corresponding to the delay measurement circuit in FIG. 2. FIG. 3A first shows a state of the reference clock signal REFCLK and a state of the feedback clock signal FBCLK before the DLL is locked. In this case, there is a phase difference between the rising edge of the reference clock signal REFCLK and the rising edge of the feedback clock signal FBCLK. The phase difference is denoted by Tdelta_ref2fb. That is, Tdelta_ref2fb>0. After the DLL is locked, the phase difference between the rising edge of the reference clock signal REFCLK and the rising edge of the feedback clock signal FBCLK is 0, and the rising edges are aligned. After the DLL is locked, a high-level lock flag signal LOCKFLAG is generated. After the high-level lock flag signal LOCKFLAG is sampled at the 6th rising edge of REFCLK, the FREEZE signal changes to a low level. Such an operation is completed in the freeze signal generation module Freeze in FIG. 2. A period of time from a moment at which the high-level lock flag signal LOCKFLAG is sampled at the rising edge of REFCLK to a moment at which a low-level FREEZE signal is generated is denoted as Tsyn_freeze_gen. A REFCLKB signal is obtained after the reference clock signal REFCLK is inverted. A NAND logic operation is performed on the REFCLKB signal and the FREEZE signal, to generate a loop input signal LOOPCLK_IN. The low-level FREEZE signal blocks REFCLK from entering the DLL, but clock pulses 0 to 6 having entered the loop previously may still arrive at an output terminal of the feedback clock signal FBCLK. FBCLK is utilized as a clock, and the FREEZE signal is sampled through the cascaded D flip-flops. If the FREEZE signal is at a low level, a sampling result is 1. As shown in FIG. 3, the low-level FREEZE signal is sampled at rising edges of the clock pulses 1 to 6 of the FBCLK signal, to obtain LM_TM<6:0>=0111111. A value obtained when the thermometer code is converted into the binary code is 6, and indicates that a clock pulse entering the DLL is output from the loop after expiration of six cycles. In other words, the delay of the DLL is equal to six times an FBCLK cycle, and is also equal to six times a REFCLK cycle. Because REFCLK is generated by performing a frequency divide-by-2 operation by the frequency divider, and a clock cycle of REFCLK is 2 tck, six times the REFCLK cycle is actually equal to 12*tck. In other words, the delay of the DLL is equal to 12*tck, and the value of N is equal to 12.

For the delay measurement circuit shown in FIG. 2, a delay between the rising edge that is of REFCLK and at which the FREEZE signal is sampled and a falling edge of the FREEZE signal after sampling is a margin of the delay measurement circuit. It is found through research that the margin needs to be less than 1 tck to ensure correct loop delay measurement. It is found through research that the margin is consumed at two places in this circuit. The first place is an absolute delay of generating the FREEZE signal through sampling based on REFCLK, that is, Tsyn_freeze_gen. The second place is the phase difference between REFCLK and FBCLK after the DLL is locked, that is, Tdelta_ref2fb. Therefore, to ensure accuracy of the delay measurement circuit, the following margin conditions need to be met: Tsyn_freeze_gen+Tdelta_ref2fb<1 tCK.

Figure 3B:
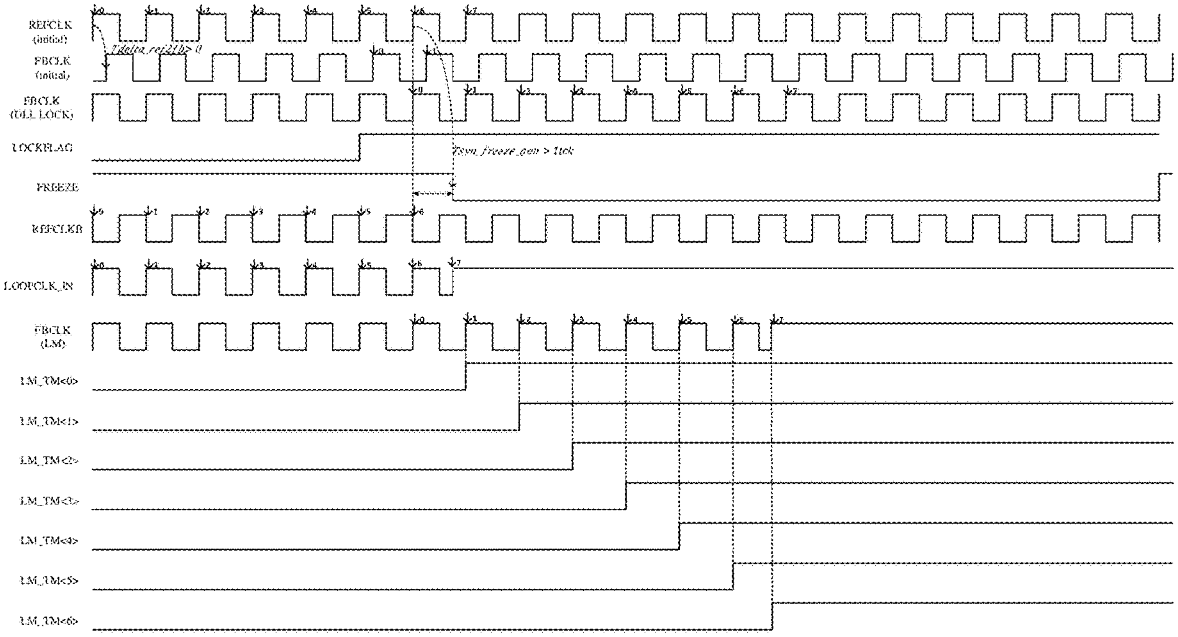
FIG. 3B is a signal waveform diagram of a delay measurement circuit in another case.

FIG. 3B shows a case in which a loop delay measurement error is caused because Tsyn_freeze_gen is too large and exceeds a margin of 1 tck. Because Tsyn_freeze_genk>1 tck, after a LOOPFLAG signal is sampled at the 6th rising edge of REFCLK, a falling edge of FREEZE is generated only after a time exceeding 1 tck. Therefore, the 6th falling edge of REFCLK, that is, the 6th rising edge of REFCLKB, enters the loop, and the 6th falling edge of LOOPCLK_IN is generated. When FREEZE changes to 0 again, the 7th rising edge of LOOPCLK_IN is generated and also enters the loop. Therefore, FBCLK output by the loop has seven rising edges 1 to 7, and the low-level FREEZE signal is sampled, to obtain LM_TM<6:0>=1111111. A value obtained when the thermometer code is converted into a binary code is 7. Finally, a value that is of N and that is obtained through conversion is equal to 14, and a loop delay measurement error is caused.

In addition, when the phase difference Tdelta_ref2fb between REFCLK and FBCLK after the DLL is locked is greater than 0, a loop measurement margin is also occupied. For example, when the DRAM performs a self-refresh operation, power consumption is relatively large, and power noise is generated, thereby affecting a DLL circuit. In this case, the phase difference Tdelta_ref2fb between the reference clock signal and the feedback clock signal is greater than 0. If loop delay measurement is performed in this case, more limitations are imposed on the margin, and a risk of a failure is greater. For another example, loop delay measurement is performed after a fast lock function is utilized for the DLL. Because there is a specific error when the reference clock signal and the feedback clock signal are aligned based on the fast lock function, and the error also causes a case in which Tdelta_ref2fb is greater than 0, the loop measurement margin is limited, thereby causing a failure.

In conclusion, as a working frequency of a memory increases, the margin of 1 tck in a loop measurement solution continuously decreases. In actual applications, Tsyn_freeze_gen+Tdelta_ref2fb<1 tCK needs to be met. However, it is usually difficult to implement Tsyn_freeze_gen+Tdelta_ref2fb<1 tCK due to impact of factors such as a change of a manufacturing process, a temperature, and a voltage. A loop measurement solution with a larger margin is urgently required, to meet a requirement of a high-speed memory.

Based on this, an embodiment of the present disclosure provides a delay measurement circuit, applied to a delay-locked loop and including: a loop flag generation circuit, electrically connected to a loop of the delay-locked loop, and configured to: generate a loop flag signal and input the loop flag signal to the loop of the delay-locked loop when loop delay measurement is performed on the delay-locked loop; and generate a measurement finish signal and generate a target pulse signal after the loop flag signal is cycled for M times in the loop of the delay-locked loop, a valid pulse width of the target pulse signal being equal to M times a loop delay, and M being an even number greater than 1; and a counter circuit, electrically connected to the loop flag generation circuit, and configured to: receive a divided clock signal; time the valid pulse width of the target pulse signal based on the divided clock signal, to obtain a timing result; and perform preset processing on the timing result, to obtain a loop delay measurement result of the delay-locked loop. In this solution, the loop flag signal is input to the loop of the delay-locked loop, and is cycled for M cycles, to obtain M times the loop delay, which is reflected by the valid pulse width of the target pulse signal, and the M times the loop delay is timed based on the divided clock signal. In this way, the delay measurement circuit has a larger measurement margin, avoiding a loop delay measurement error occurring due to an insufficient margin at a high clock frequency, and improving accuracy of loop delay measurement.

The following describes the embodiments of the present disclosure in detail with reference to the accompanying drawings.

Figure 4:
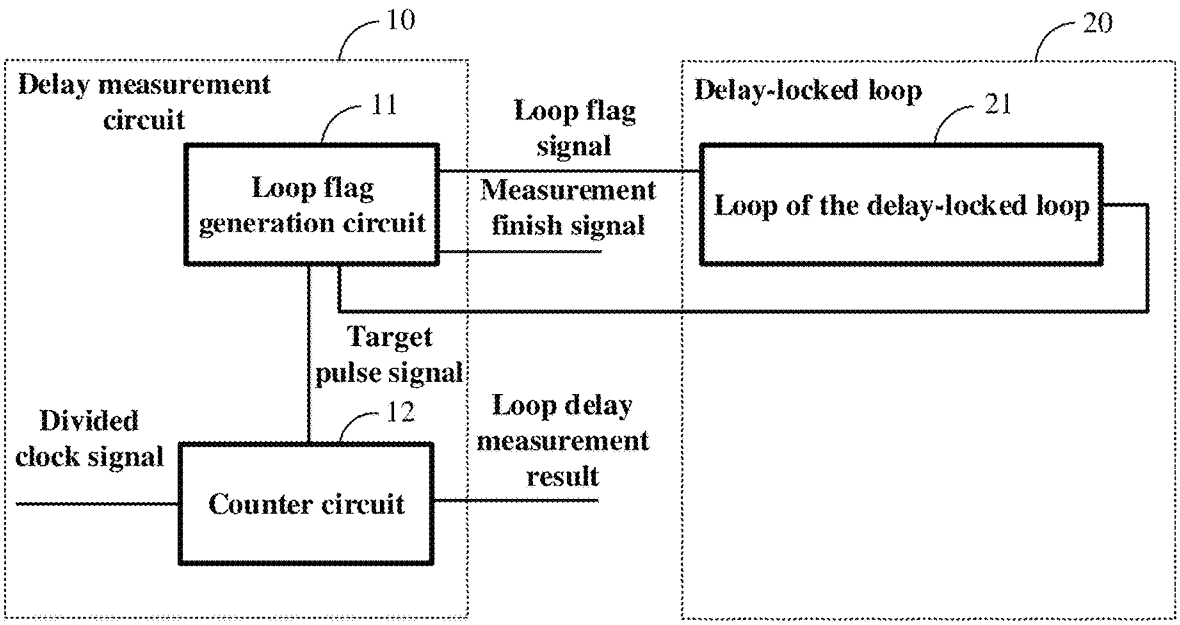
FIG. 4 is a schematic structural diagram of a delay measurement circuit according to an embodiment of the present disclosure.

In an embodiment of the present disclosure, FIG. 4 is a schematic structural diagram of a delay measurement circuit 10 according to an embodiment of the present disclosure. As shown in FIG. 4, the delay measurement circuit 10 includes:

- a loop flag generation circuit 11, electrically connected to a loop 21 of the delay-locked loop 20, and configured to: generate a loop flag signal and input the loop flag signal to the loop 21 of the delay-locked loop when loop delay measurement is performed on the delay-locked loop 20; and generate a measurement finish signal and generate a target pulse signal after the loop flag signal is cycled for M times in the loop 21 of the delay-locked loop, a valid pulse width of the target pulse signal being equal to M times a loop delay, and M being an even number greater than 1; and
- a counter circuit 12, electrically connected to the loop flag generation circuit 11, and configured to: receive a divided clock signal; time the valid pulse width of the target pulse signal based on the divided clock signal, to obtain a timing result; and perform preset processing on the timing result, to obtain a delay measurement result of the loop 21 of the delay-locked loop.

It should be noted that the delay measurement circuit 10 in this embodiment of the present disclosure may be applied to any electronic device including a delay-locked loop, e.g., a memory, a controller, or a processor.

The loop flag generation circuit 11 inputs the loop flag signal to the loop 21 of the delay-locked loop. After the loop flag signal is cycled for M cycles in the loop 21 of the delay-locked loop, M times the loop delay may be obtained. The loop flag generation circuit 11 generates the target pulse signal, and reflects the M times the loop delay with the valid pulse width of the target pulse signal. Because M is an even number greater than 1, the M times the loop delay is also an even number. The counter circuit 12 measures the loop delay based on a divided clock signal, to obtain more margins. In this way, a relatively wide pulse is measured based on the divided clock signal, so that the delay measurement circuit has a larger measurement margin, avoiding a loop delay measurement error occurring due to an insufficient margin at a high clock frequency, and improving accuracy of loop delay measurement.

In some embodiments, the preset processing includes: performing processing on the timing result based on a frequency of the divided clock signal and a value of M, to obtain the loop delay measurement result. For example, if M is equal to 4, that is, the loop flag signal is cycled for four times in the loop 21 of the delay-locked loop, the valid pulse width of the target pulse signal is equal to four times the loop delay. If the loop delay is denoted by N*tck, the valid pulse width of the target pulse signal is 4N*tck. If the valid pulse width is timed based on a clock signal obtained by performing a frequency divide-by-8 operation, the timing result is (4N*tck)/(8*tck)=N/2. In this case, the preset processing is to multiply the timing result by 2, to obtain a true loop delay measurement result N. A designer may set preset processing based on a pre-selected value of M and the frequency of the divided clock signal. Because M is an even number, the M times the loop delay is also an even number. More margins may be obtained based on the divided clock signal herein.

Figure 5:
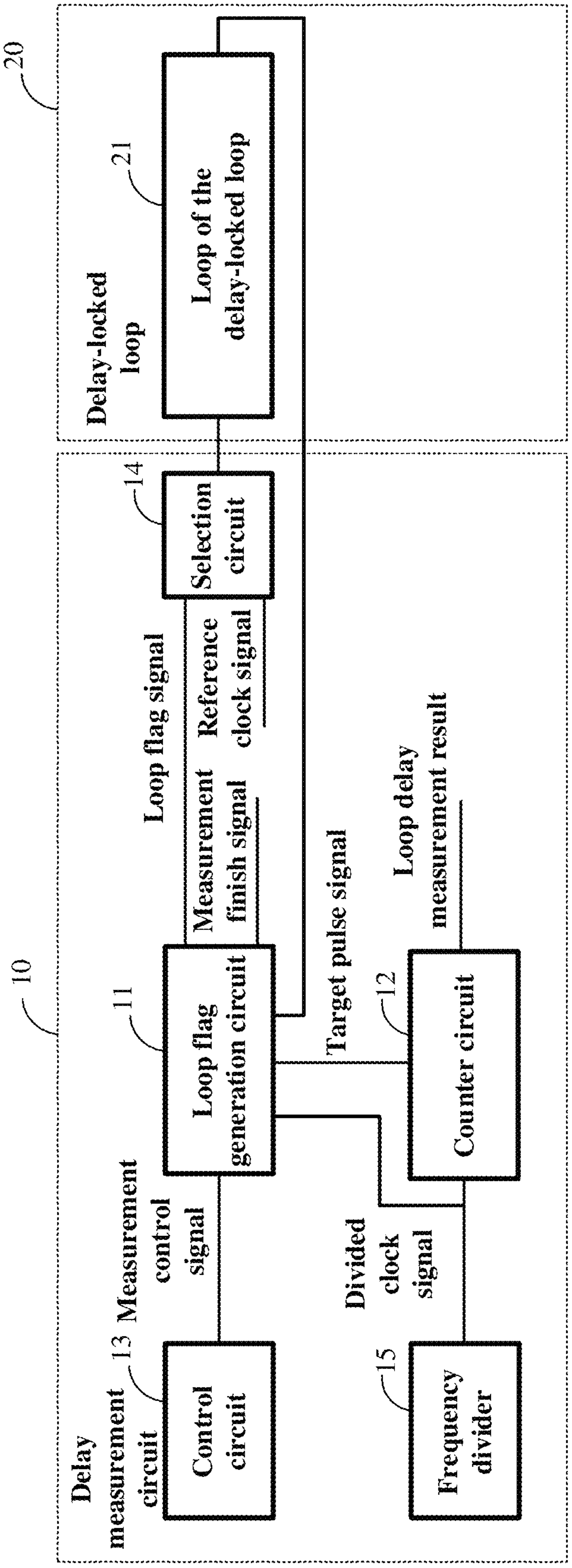
FIG. 5 is a schematic structural diagram of a delay measurement circuit according to an embodiment of the present disclosure.

In some embodiments, as shown in FIG. 5, the delay measurement circuit 10 further includes:

a control circuit 13, configured to: generate a measurement control signal of a first level when loop delay measurement is performed on the delay-locked loop 20, and generate a measurement control signal of a second level at a remaining moment. The measurement control signal may be utilized to indicate whether to start to perform loop delay measurement.

In some embodiments, the control circuit 13 receives a lock flag signal and the measurement finish signal, generates the measurement control signal of the first level in response to the lock flag signal, and generates the measurement control signal of the second level in response to the measurement finish signal, and the lock flag signal represents that phase locking of the delay-locked loop is completed. Loop delay measurement is performed on the DLL on the premise that the DLL is locked. Only in this way, can it be ensured that the loop delay of the DLL is an integral multiple of the clock cycle. Therefore, the control circuit 13 can generate the measurement control signal of the first level only when the received lock flag signal indicates that the DLL is locked, to indicate to start to perform loop delay measurement. In addition, when the measurement finish signal indicates that loop delay measurement is completed, the measurement control signal of the second level is generated.

Figure 6:
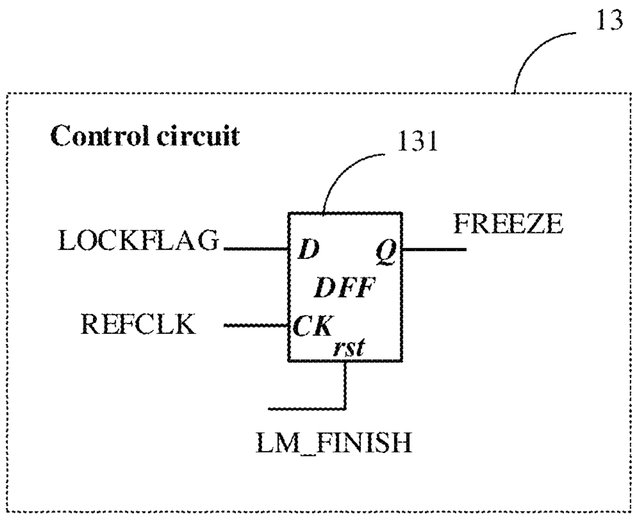
FIG. 6 is a schematic structural diagram of a control circuit according to an embodiment of the present disclosure.

In some embodiments, as shown in FIG. 6, the control circuit includes:

an eighth flip-flop 131, a clock terminal of the eighth flip-flop 131 receiving a reference clock signal REFCLK, a data terminal of the eighth flip-flop 131 receiving the lock flag signal LOCKFLAG, an output terminal of the eighth flip-flop 131 outputting the measurement control signal FREEZE, and a reset terminal of the eighth flip-flop 131 receiving the measurement finish signal LM_FINISH. LOCKFLAG is sampled based on REFCLK, and then the measurement control signal FREEZE is generated, to facilitate accurate timing of subsequent processing. The eighth flip-flop 131 may be a D flip-flop.

In some embodiments, as shown in FIG. 5, the delay measurement circuit 10 further includes:

a selection circuit 14, electrically connected to the loop 21 of the delay-locked loop, and configured to: choose to input the loop flag signal to the loop 21 of the delay-locked loop when loop delay measurement is performed on the delay-locked loop 20; and input a reference clock signal to the loop 21 of the delay-locked loop at a remaining moment.

Figure 7:
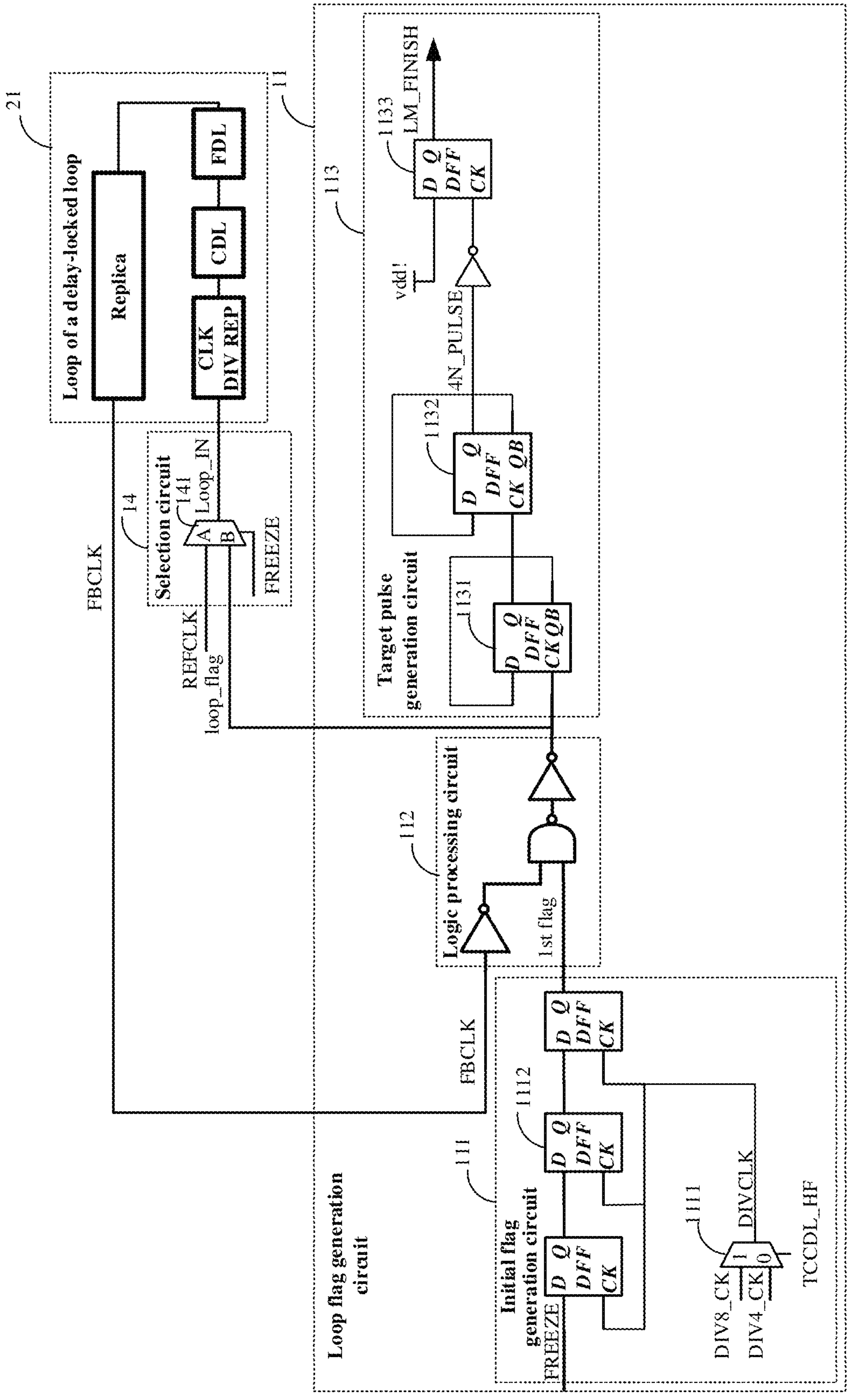
FIG. 7 is a schematic diagram of a partial structure of a delay measurement circuit according to an embodiment of the present disclosure.

In some embodiments, as shown in FIG. 7, the selection circuit 14 may include a multiplexer 141. A first terminal of the multiplexer 141 receives the reference clock signal REFCLK, a second terminal receives the loop flag signal loop_flag, and a control terminal receives the measurement control signal FREEZE. When the measurement control signal FREEZE is at the first level, the loop flag signal loop_flag is selected to be output as a loop entry signal Loop_IN. When the measurement control signal FREEZE is at the second level, the reference clock signal REFCLK is selected to be output as a loop entry signal Loop_IN.

In some embodiments, as shown in FIG. 7, the loop flag generation circuit 11 includes:

an initial flag generation circuit 111, configured to generate an initial loop flag signal 1st flag after waiting for a preset cycle, in response to that the measurement control signal FREEZE changes from the second level to the first level, the preset cycle being a first value when a working frequency of the delay-locked loop 20 is greater than a preset frequency; the preset cycle being a second value when the working frequency of the delay-locked loop is less than or equal to the preset frequency; and the first value being greater than the second value; and a logic processing circuit 112, electrically connected to the loop 21 of the delay-locked loop, and configured to: receive a signal FBCLK through a feedback terminal of the loop 21, perform inversion processing on FBCLK, and perform AND logic processing on a signal obtained after the inversion processing and the initial loop flag signal 1st flag, to generate the loop flag signal loop_flag.

It may be understood that the initial flag generation circuit 111 generates the initial loop flag signal 1st flag only after waiting for a period of time after the FREEZE signal represents that loop delay measurement starts to be performed, to clear a clock pulse having entered the loop before measurement starts, so as to ensure that when the target pulse signal is subsequently generated, a clock having entered the loop previously imposes no impact, and finally ensure accuracy of delay measurement. When the working frequency of the DLL is relatively high, a value of 1 tck is relatively small, and the clock pulse having entered the loop before measurement starts can be cleared only after waiting for a relatively large quantity of clock cycles. When the working frequency of the DLL is relatively low, a value of 1 tck is relatively large, and a clearing operation can be completed after waiting for a relatively small quantity of clock cycles. This can ensure that the following case is avoided: A too long waiting time is consumed at a low frequency, and consequently, an overall working time of the DLL exceeds a time limit. For example, when the working frequency of the DLL is greater than the preset frequency, the loop may be cleared after waiting for 32*tck, and when the working frequency of the DLL is less than or equal to the preset frequency, the loop may be cleared after waiting for 16*tck.

The logic processing circuit 112 sends the initial loop flag signal 1st flag, namely, the 1st flag bit, to the DLL; and after the 1st flag bit is output through the feedback terminal, negates the 1st flag bit for one time, and considers that in this case, the 1st flag bit is delayed by N*tck, that is, one time the loop delay. A flag bit obtained through negation is sent to the DLL again, to perform a next time of loop delaying. When the flag bit arrives at the feedback terminal of the DLL for the Mth time, that is, after M times loop delaying is performed, the flag bit is no longer sent to the DLL, and a delay of the flag bit is M*N*tck.

In some embodiments, as shown in FIG. 7, the loop flag generation circuit 11 further includes:

a target pulse generation circuit 113, configured to: count a change edge of the loop flag signal loop_flag, start to generate a valid pulse of the target pulse signal 4N_PULSE in response to the 1st change edge of the loop flag signal loop_flag, finish the valid pulse of the target pulse signal 4N_PULSE in response to the (M+1)th change edge of the loop flag signal loop_flag, and generate the measurement finish signal LM_FINISH in response to that the valid pulse of the target pulse signal 4N_PULSE is finished.

It may be understood that the 1st change edge of the loop flag signal loop_flag is a moment at which loop_flag starts to enter the loop. The (M+1)th change edge of the loop flag signal loop_flag is a moment at which the loop flag signal loop_flag is output through the feedback terminal after being cycled for M cycles in the loop. Therefore, a time difference between the 1st change edge and the (M+1)th change edge of the loop flag signal loop_flag is M times the loop delay, namely, M*N*tck. Therefore, the valid pulse width of the target pulse signal 4N_PULSE generated in response to the 1st change edge and the (M+1)th change edge of the loop flag signal loop_flag is also equal to M*N*tck. When the valid pulse of the target pulse signal 4N_PULSE is finished, the measurement finish signal LM_FINISH is generated, and indicates that loop delay measurement is finished. Measurement is finished in a timely manner, to avoid wasting a measurement time and power consumption.

In some embodiments, as shown in FIG. 7, the initial flag generation circuit 111 includes:

a first selector 1111, configured to: receive a frequency representation signal TCCDL_HF, a first divided clock signal DIV8_CK, and a second divided clock signal DIV4_CK; select the first divided clock signal DIV8_CK and output the first divided clock signal DIV8_CK as a timing clock signal DIVCLK when the frequency representation signal TCCDL_HF indicates that the working frequency of the delay-locked loop 20 is greater than the preset frequency; select the second divided clock signal DIV4_CK and output the second divided clock signal DIV4_CK as the timing clock signal DIVCLK when the frequency representation signal TCCDL_HF indicates that the working frequency of the delay-locked loop 20 is less than or equal to the preset frequency, a frequency of the second divided clock signal DIV4_CK being higher than a frequency of the first divided clock signal DIV8_CK; and A cascaded first flip-flops 1112, configured to: receive the timing clock signal DIVCLK at a clock terminal of each of the first flip-flops, receive the measurement control signal FREEZE at a data terminal of the first flip-flop at a first stage, a data terminal of each of the first flip-flops after the first stage being connected to an output terminal of a first flip-flop at a previous stage, and output the initial loop flag signal 1st flag at an output terminal of a first flip-flop at a last stage, A being an integer greater than 1.

It may be understood that, multiple cascaded first flip-flops 1112 are utilized, the measurement control signal FREEZE is received at the data terminal of the first flip-flop at the first stage, and the initial loop flag signal 1st flag is output at the output terminal of the first flip-flop at the last stage. In this way, after the FREEZE signal represents that loop delay measurement starts to be performed, the initial loop flag signal 1st flag can be generated only after waiting for a period of time, and the clock pulse having entered the loop before measurement starts is cleared. In FIG. 7, that A is equal to 3 is taken as an example, and three cascaded first flip-flops are shown. In this case, after the first flip-flop at the first stage samples the FREEZE signal and the FREEZE signal changes from the second level to the first level, the initial loop flag signal 1st flag is output from a first flip-flop at a third stage only after waiting for a cycle of two timing clock signals DIVCLK. Based on the first selector 1111, one of two divided clock signals with different frequencies may be selected as the timing clock signal DIVCLK. When the working frequency of the DLL is relatively high, the value of 1 tck is relatively small, and the clock pulse having entered the loop before measurement starts can be cleared only after waiting for a relatively large quantity of clock cycles. Therefore, the first divided clock signal DIV8_CK with a relatively low frequency and a relatively long clock cycle needs to be selected as the timing clock signal DIVCLK. When the working frequency of the DLL is relatively low, the value of 1 tck is relatively large, and the clearing operation can be completed after waiting for a relatively small quantity of clock cycles. Therefore, the second divided clock signal DIV4_CK with a relatively high frequency and a relatively short clock cycle is selected as the timing clock signal DIVCLK. For example, A is equal to 3, the first divided clock signal DIV8_CK is obtained after a frequency divide-by-8 operation is performed on REFCLK, and the second divided clock signal DIV4_CK is obtained after a frequency divide-by-4 operation is performed on REFCLK. Because REFCLK is generated by performing a frequency divide-by-2 operation by a frequency divider, and a clock cycle of REFCLK is 2 tck, a cycle of the first divided clock signal DIV8_CK is 16 tck, and a cycle of the second divided clock signal DIV4_CK is 8 tck. When the working frequency of the DLL is relatively high, and a cycle of the timing clock signal DIVCLK is 16 tck, the initial loop flag signal 1st flag needs to be output from the first flip-flop at the third stage only after waiting for 32 tck. When the working frequency of the DLL is relatively low, and a cycle of the timing clock signal DIVCLK is 8 tck, the initial loop flag signal 1st flag needs to be output from the first flip-flop at the third stage only after waiting for 16 tck. The frequency representation signal TCCDL_HF is utilized to represent a working frequency of the memory, namely, the working frequency of the DLL. The signal may be obtained by determining a delay (CAS to CAS Delay, CCDL) before a column strobe signal specified in the memory. Usually, a higher working frequency of the memory leads to a setting of a larger value of the CCDL. Therefore, the working frequency of the memory may be obtained based on the value of the CCDL, to generate a frequency representation signal. The first flip-flop 1112 may be a D flip-flop. In actual applications, the designer may flexibly select a value of A, a frequency of the first divided clock signal, and a frequency of the second divided clock signal according to a requirement, provided that the loop can be cleared and a test time is not wasted.

In some embodiments, as shown in FIG. 5, the delay measurement circuit 10 further includes:

a frequency divider 15, configured to: receive a reference clock signal REFCLK, and perform frequency division processing on the reference clock signal REFCLK, to generate multiple divided clock signals, the multiple divided clock signals including at least the first divided clock signal DIV8_CK and the second divided clock signal DIV4_CK.

Figure 8:
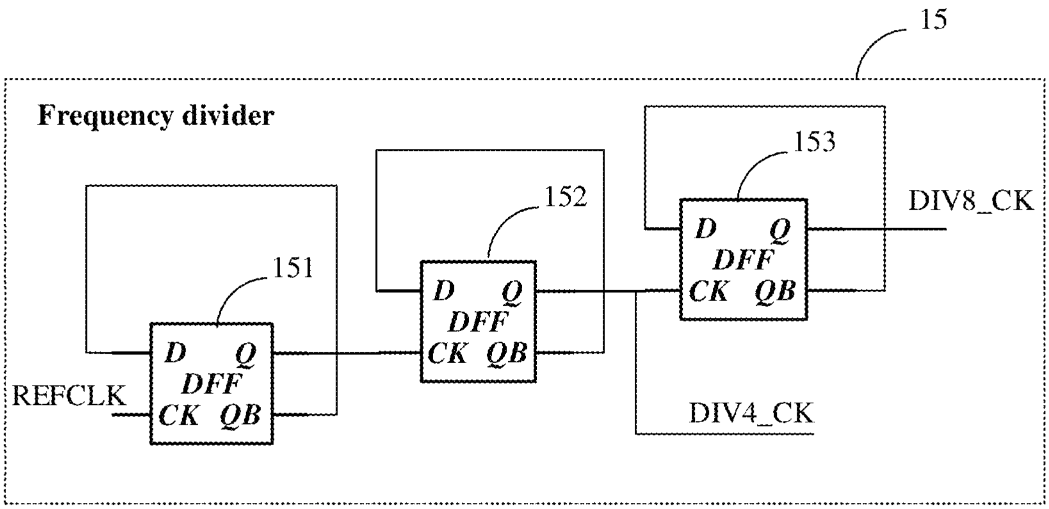
FIG. 8 is a schematic structural diagram of a frequency divider according to an embodiment of the present disclosure.

In some embodiments, as shown in FIG. 8, the frequency divider 15 includes:

a second flip-flop 151, a clock terminal of the second flip-flop 151 receiving the reference clock signal REFCLK, and a data terminal of the second flip-flop 151 being connected to an inverting output terminal of the second flip-flop 151;

- a third flip-flop 152, a clock terminal of the third flip-flop 152 being connected to the output terminal of the second flip-flop 151, a data terminal of the third flip-flop 152 being connected to an inverting output terminal of the third flip-flop 152, an output terminal of the third flip-flop 152 outputting the second divided clock signal DIV4_CK, and a clock cycle of the second divided clock signal DIV4_CK being four times a clock cycle of the reference clock signal REFCLK; and
- a fourth flip-flop 153, a clock terminal of the fourth flip-flop 153 being connected to the output terminal of the third flip-flop 152, a data terminal of the fourth flip-flop 153 being connected to an inverting output terminal of the fourth flip-flop 153, an output terminal of the fourth flip-flop 153 outputting the first divided clock signal DIV8_CK, and a clock cycle of the first divided clock signal DIV8_CK being eight times the clock cycle of the reference clock signal REFCLK.

In this way, a divided clock signal required by the initial flag generation circuit 111 and the counter circuit 12 may be generated. In actual applications, the designer may further add a flip-flop based on such a principle according to a requirement, to obtain more divided clock signals. D flip-flops may be selected as the second flip-flop, the third flip-flop, and the fourth flip-flop.

In some embodiments, as shown in FIG. 7, the target pulse generation circuit 113 includes:

- a fifth flip-flop 1131, a clock terminal of the fifth flip-flop 1131 receiving the loop flag signal loop_flag, and a data terminal of the fifth flip-flop 1131 being connected to an inverting output terminal of the fifth flip-flop 1131;
- a sixth flip-flop 1132, a clock terminal of the sixth flip-flop 1132 being connected to the output terminal of the fifth flip-flop 1131, a data terminal of the sixth flip-flop 1132 being connected to an inverting output terminal of the sixth flip-flop 1132, and the output terminal of the sixth flip-flop 1132 outputting the target pulse signal 4N_PULSE; and
- a seventh flip-flop 1133, a clock terminal of the seventh flip-flop 1133 receiving an inverted signal of the target pulse signal 4N_PULSE, a data terminal of the seventh flip-flop 1133 receiving a power signal VDD, and an output terminal of the seventh flip-flop 1133 outputting the measurement finish signal LM_FINISH.

In FIG. 7, that M is equal to 4 and the loop flag signal loop_flag is cycled for four times in the loop is taken as an example. When the initial loop flag signal 1st flag is generated, that is, when the 1st flag bit is generated, the loop flag signal loop_flag has the 1st rising edge, and both the fifth flip-flop 1131 and the sixth flip-flop 1132 output a high level, so that the target pulse signal 4N_PULSE is output to be at a high level. The 1st flag bit is sent to the DLL, and is returned to the loop flag generation circuit 11 through the feedback terminal after being delayed in the DLL, and the 2nd flag bit 2nd flag is obtained through negation, and is sent to the DLL again. In this case, the clock terminal of the fifth flip-flop 1131 receives a falling edge of the loop flag signal loop_flag, so that an output of the fifth flip-flop 1131 and an output of the sixth flip-flop 1132 do not change. When the 2nd flag bit 2nd flag is output through the feedback terminal of the DLL, the 3rd flag bit 3rd flag is obtained through negation. In this case, the clock terminal of the fifth flip-flop 1131 receives a rising edge of the loop flag signal loop_flag, so that the fifth flip-flop 1131 outputs a low level, and the output of the sixth flip-flop 1132 remains unchanged. By analogy, when the 4th flag bit 4th flag is output through the feedback terminal of the DLL, the output of the sixth flip-flop 1132 changes to a low level. In other words, the output of the target pulse signal 4N_PULSE changes to a low level. Therefore, the valid pulse width of the target pulse signal 4N_PULSE is equal to four times the delay of the DLL. In this method, the M times the loop delay is reflected by the valid pulse width of the target pulse signal. When the output of the target pulse signal 4N_PULSE changes to a low level, the inverted signal of the target pulse signal 4N_PULSE changes to a high level, and the power signal VDD is sampled by the seventh flip-flop 1133 at a rising edge of the inverted signal, to generate and output the measurement finish signal LM_FINISH, indicating that a loop delay measurement operation may be finished in this case. The measurement finish signal LM_FINISH is utilized to reset the measurement control signal FREEZE, so that FREEZE changes to the second level. In addition, the loop flag signal loop_flag is not selected to enter the DLL, but the reference clock signal REFCLK is selected to enter the DLL.

Figure 9:
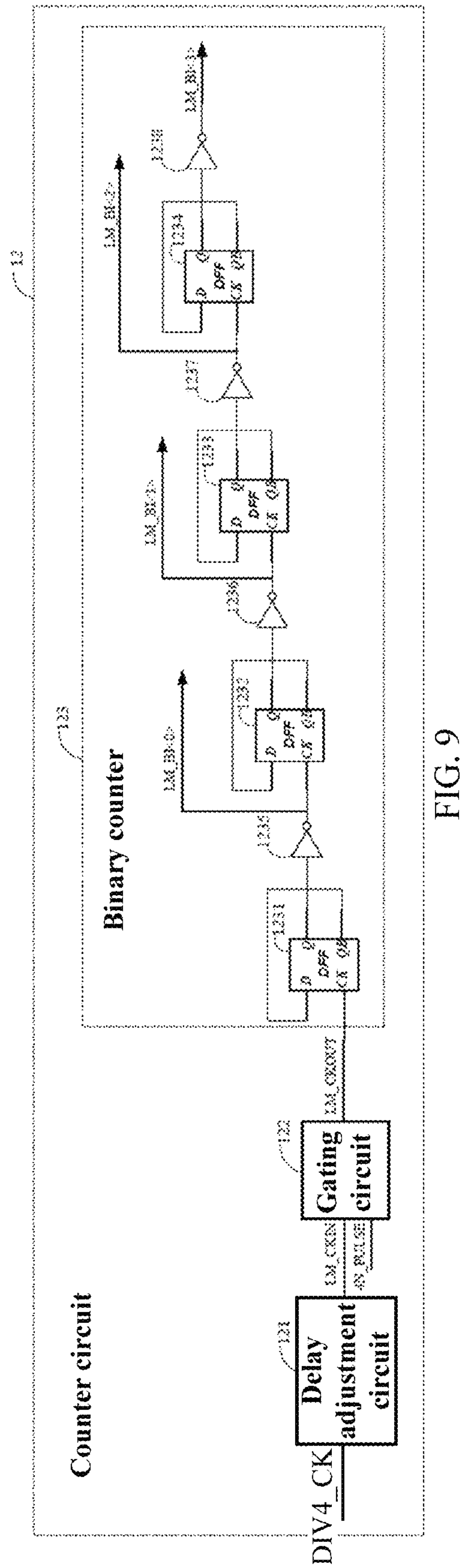
FIG. 9 is a schematic structural diagram of a counter circuit according to an embodiment of the present disclosure.

In some embodiments, as shown in FIG. 9, the counter circuit 12 includes a delay adjustment circuit 121, a gating circuit 122, and a binary counter 123.

The delay adjustment circuit 121 is configured to: receive the divided clock signal, and delay the divided clock signal by first adjustment duration, to generate an adjusted divided clock signal LM_CKIN. The first adjustment duration is utilized to match a physical delay required for generating the target pulse signal 4N_PULSE by the loop flag generation circuit 11. In addition to the preset cycle that needs to be waited for, duration from a moment at which the measurement control signal FREEZE changes from the second level to the first level to a moment at which a rising edge of the target pulse signal 4N_PULSE is generated includes a physical delay of a circuit of various circuit elements such as a logic processing circuit and a flip-flop. The physical delay is an absolute delay value not determined in clock cycles. Because both a clock for generating the target pulse signal 4N_PULSE and the divided clock signal originate from the same clock source REFCLK, the divided clock signal is delayed by the first adjustment duration, to match the physical delay, so as to ensure subsequent timing accuracy of the target pulse signal 4N_PULSE.

The gating circuit 122 is configured to: receive the adjusted divided clock signal LM_CKIN and the target pulse signal 4N_PULSE, and perform gating processing on the adjusted divided clock signal LM_CKIN based on the target pulse signal 4N_PULSE, to generate a counting clock signal LM_CKOUT. The gating circuit 122 may be usually implemented through an AND logic circuit, provided that the valid counting clock signal LM_CKOUT is output within the valid pulse width of the target pulse signal 4N_PULSE. A circuit structure is not specifically limited herein.

The binary counter 123 is configured to count a clock pulse of the counting clock signal LM_CKOUT, to generate a binary timing result. FIG. 9 shows a 4-bit binary counter, including four D flip-flops 1231, 1232, 1233, and 1234 and four inverters 1235, 1236, 1237, and 1238. For a specific connection manner, refer to FIG. 9. Details are not described herein again. The binary counter counts the clock pulse of the counting clock signal LM_CKOUT, to generate the binary timing result LM_BI<3:0>. The binary timing result may be directly obtained herein, and no conversion needs to be performed by a decoder module, thereby reducing a layout area and reducing circuit power consumption.

In some embodiments, the preset processing includes: performing shift processing on the binary timing result based on a frequency of the divided clock signal and a value of M, to obtain the loop delay measurement result. For example, if M is equal to 4, that is, the loop flag signal is cycled for four times in the loop 21 of the delay-locked loop, the valid pulse width of the target pulse signal is equal to four times the loop delay. If the loop delay is denoted by N*tck, the valid pulse width of the target pulse signal is 4N*tck. If the valid pulse width is timed based on a clock signal obtained by performing a frequency divide-by-8 operation, the timing result is (4N*tck)/(8*tck)=N/2. In this case, the preset processing is to multiply the timing result by 2, that is, to shift the binary timing result leftward by 1 bit, to obtain the true loop delay measurement result N. The designer may set preset processing based on a pre-selected value of M and the frequency of the divided clock signal.

In some embodiments, a difference between a time in which the loop flag signal loop_flag is cycled for one time in the loop 21 of the delay-locked loop and a time in which the reference clock signal REFCLK is cycled for one time in the loop 21 of the delay-locked loop is less than a first preset value. Because additional logic gate circuits such as the logic processing circuit 112 and the selection circuit 14 are required when the loop flag signal loop_flag enters the DLL, an additional delay is caused. Therefore, matching needs to be performed on a delay of REFCLK and a delay of loop_flag in the DLL, so that an absolute value of a delay difference between the delay of REFCLK and the delay of loop_flag in the DLL is less than the first preset value, to avoid affecting a result of loop delay measurement.

Figure 10:
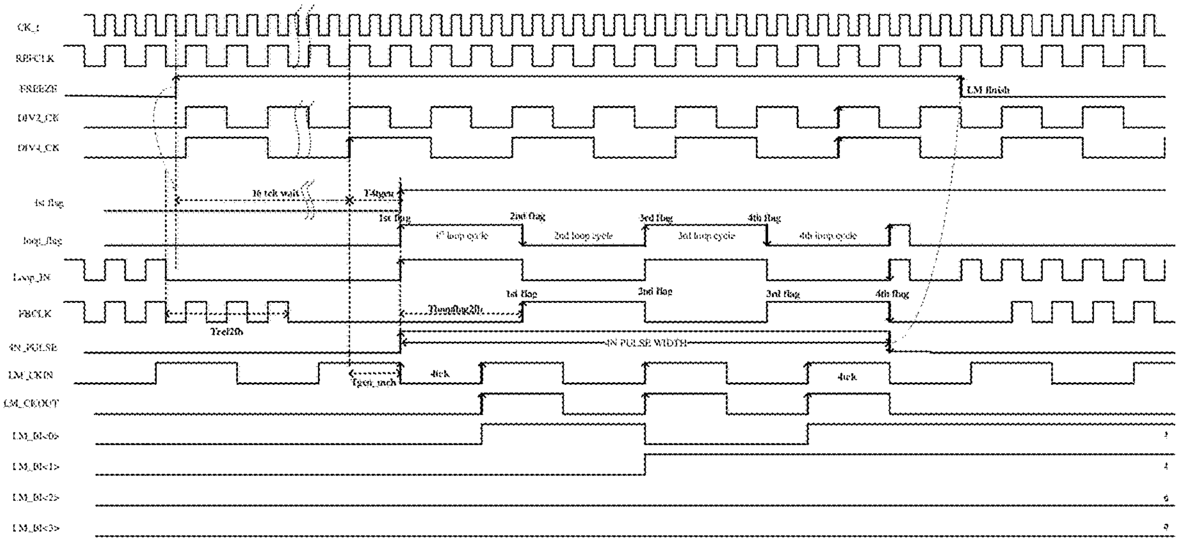
FIG. 10 is a signal waveform diagram of a delay measurement circuit according to an embodiment of the present disclosure.

FIG. 10 is a signal waveform diagram of a delay measurement circuit according to an embodiment of the present disclosure. In this example, the loop delay of the DLL is 6*tck, and N=6. The value of M is 4. In other words, the loop flag signal is cycled for four times in the loop 21 of the delay-locked loop. An external clock signal CK_t and the reference clock signal REFCLK are first shown in the figure. A clock cycle of CK_t is tck, and REFCLK is generated by performing a frequency divide-by-2 operation. Therefore, the clock cycle of REFCLK is 2*tck. REFCLK passes through the frequency divider and the second divided clock signal DIV4_CK is generated, and the clock cycle of the second divided clock signal DIV4_CK is 8*tck. Herein, that the working frequency of the DLL is less than or equal to the preset frequency, and A=3 is taken as an example. Therefore, the second divided clock signal DIV4_CK is utilized to sample the measurement control signal FREEZE. In response to that the measurement control signal FREEZE changes from the second level to the first level, the initial loop flag signal 1st flag is generated after waiting for 16*tck. Herein, the first level is set to a high level, and the second level is set to a low level. In response to that the initial loop flag signal changes to a high level, the first rising edge of the loop flag signal loop_flag, namely, the 1st flag bit is also generated. The 1st flag bit is sent to the DLL, and is returned to the loop flag generation circuit 11 through the feedback terminal after being delayed in the DLL, and the 2nd flag bit 2nd flag, namely, the 1st falling edge of the loop flag signal loop_flag is obtained through negation, and is sent to the DLL again. This is repeated for four times. Loop_IN is an output of the selection circuit. During loop measurement, Loop_IN is a loop test signal loop_flag. Based on the foregoing described working principle of the target pulse generation circuit 113, in response to the 1st change edge of the loop flag signal loop_flag, namely, the 1st flag bit 1st flag, the target pulse signal 4N_PULSE changes from a low level to a high level. In response to the 4th change edge of FBCLK after 1st flag is generated, that is, the 5th change edge of loop_flag, the target pulse signal 4N_PULSE changes from a high level to a low level, and the valid pulse is finished. The valid pulse width is 4*N*tck. Herein, the delay adjustment circuit 121 receives the second divided clock signal DIV4_CK. The second divided clock signal DIV4_CK is utilized as a subsequently utilized divided clock signal. The second divided clock signal DIV4_CK is delayed by the first adjustment duration, to generate the adjusted divided clock signal LM_CKIN. Herein, the first adjustment duration is denoted by Tgen_mch. As described above, in addition to 16*tck to be waited for, duration from a moment at which the measurement control signal FREEZE changes from a low level to a high level to a moment at which the rising edge of the target pulse signal 4N_PULSE is generated further includes a physical delay of various circuit elements, and the physical delay is denoted by T4gen. In an ideal case, Tgen_mch is utilized to match T4gen. That Tgen_mch is equal to T4gen is a best case. However, in practice, if T4gen−Tgen_mch<4*tck is met, it can be ensured that no error occurs during subsequent counting. Therefore, a margin herein is 4 tck, and is four times greater than that in a previous solution. After the gating circuit 122 is passed through, the counting clock signal LM_CKOUT is output only when the target pulse signal 4N_PULSE is at a high level. A quantity of cycles of LM_CKOUT is counted, to obtain LM_BI<3:0>=0011. Based on the foregoing analysis, a true loop delay measurement result 6 can be obtained only when the binary timing result is shifted leftward by 1 bit. As shown in the figure, the time in which the loop flag signal loop_flag is cycled for one time in the loop 21 of the delay-locked loop is Tloopflag2fb, and the time in which the reference clock signal REFCLK is cycled for one time in the loop 21 of the delay-locked loop is Tref2fb. |Tloopflag2fb−Tref2fb|<1*tck needs to be met, to ensure that a last delay measurement result is correct. Therefore, the first preset value herein needs to be one clock cycle. This may be implemented by setting the same quantity of stages of logic gates when REFCLK and loop_flag enter the DLL.

As shown above, in the delay measurement circuit provided in this embodiment of the present disclosure, the loop flag signal is input to the loop of the delay-locked loop, and is cycled for M cycles, to obtain the M times the loop delay, which is reflected by the valid pulse width of the target pulse signal, and the M times the loop delay is timed based on the divided clock signal. In this way, the delay measurement circuit has a larger measurement margin, avoiding a loop delay measurement error occurring due to an insufficient margin at a high clock frequency, and improving accuracy of loop delay measurement.

Figure 11:
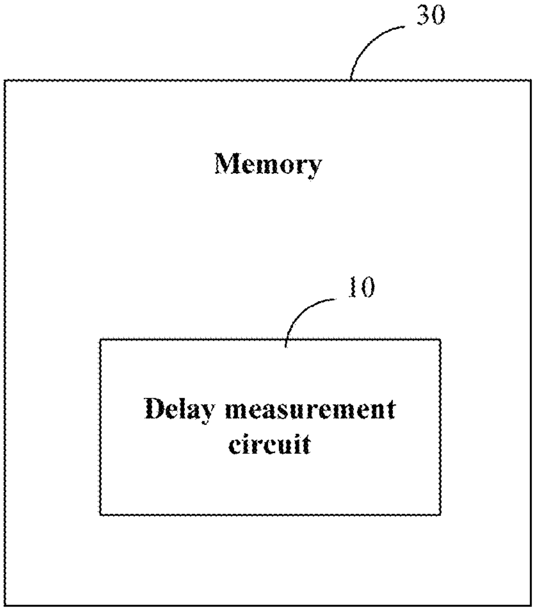
FIG. 11 is a schematic structural diagram of a memory according to an embodiment of the present disclosure.

In another embodiment of the present disclosure, FIG. 11 is a schematic diagram of structural composition of a memory 30 according to an embodiment of the present disclosure. As shown in FIG. 11, the memory 30 includes at least the foregoing delay measurement circuit 10.

In some embodiments, the memory complies with at least one of the following specifications: DDR3, DDR4, DDR5, DDR6, LPDDR3, LPDDR4, LPDDR5, and LPDDR6.

In the delay measurement circuit included in the memory, a loop flag signal is input to a loop of a delay-locked loop, and is cycled for M cycles, to obtain M times the loop delay, which is reflected by a valid pulse width of a target pulse signal, and the M times the loop delay is timed based on a divided clock signal. In this way, the delay measurement circuit has a larger measurement margin, avoiding a loop delay measurement error occurring due to an insufficient margin at a high clock frequency, and improving accuracy of loop delay measurement. Therefore, a latency required for data communication of the memory can be accurately implemented, to avoid a data transmission failure.

The foregoing embodiments are merely preferred embodiments of the present disclosure, and are not intended to limit the protection scope of the present disclosure. It should be noted that in the present disclosure, the terms "include", "comprise", or any other variant thereof are intended to cover non-exclusive inclusion, so that a procedure, method, article, or apparatus that includes a series of elements includes not only those elements but also other elements that are not expressly listed, or further includes elements inherent to such a procedure, method, article, or apparatus. An element preceded by "includes a . . . " does not, without more constraints, preclude the presence of additional identical elements in the procedure, method, article, or apparatus including the element. The sequence numbers of the foregoing embodiments of the present disclosure are merely for the purpose of description, and are not intended to indicate priorities of the embodiments. The methods disclosed in the several method embodiments provided in the present disclosure may be randomly combined when there is no conflict, to obtain new method embodiments. The features disclosed in the several product embodiments provided in the present disclosure may be randomly combined when there is no conflict, to obtain new product embodiments. The features disclosed in the several method or device embodiments provided in the present disclosure may be randomly combined when there is no conflict, to obtain new method embodiments or new device embodiments. The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A delay measurement circuit, applied to a delay-locked loop, and comprising:

a loop flag generation circuit, electrically connected to a loop of the delay-locked loop, and configured to: generate a loop flag signal and input the loop flag signal to the loop of the delay-locked loop when loop delay measurement is performed on the delay-locked loop; and generate a measurement finish signal and generate a target pulse signal after the loop flag signal is cycled for M times in the loop of the delay-locked loop, a valid pulse width of the target pulse signal being equal to M times a loop delay, and M being an even number greater than 1; and a counter circuit, electrically connected to the loop flag generation circuit, and configured to: receive a divided clock signal; time the valid pulse width of the target pulse signal based on the divided clock signal, to obtain a timing result; and perform preset processing on the timing result, to obtain a loop delay measurement result of the delay-locked loop.

2. The delay measurement circuit according to claim 1, further comprising:

a control circuit, configured to: generate a measurement control signal of a first level when loop delay measurement is performed on the delay-locked loop, and generate a measurement control signal of a second level at a remaining moment.

3. The delay measurement circuit according to claim 1, further comprising:

a selection circuit, electrically connected to the loop of the delay-locked loop, and configured to: choose to input the loop flag signal to the loop of the delay-locked loop when loop delay measurement is performed on the delay-locked loop; and input a reference clock signal to the loop of the delay-locked loop at a remaining moment.

4. The delay measurement circuit according to claim 2, wherein the loop flag generation circuit comprises:

an initial flag generation circuit, configured to generate an initial loop flag signal after waiting for a preset cycle, in response to that the measurement control signal changes from the second level to the first level, the preset cycle being a first value when a working frequency of the delay-locked loop is greater than a preset frequency; the preset cycle being a second value when the working frequency of the delay-locked loop is less than or equal to the preset frequency; and the first value being greater than the second value; and a logic processing circuit, electrically connected to the loop of the delay-locked loop, and configured to: receive a signal through a feedback terminal of the loop, perform inversion processing on the signal, and perform AND logic processing on a signal obtained after the inversion processing and the initial loop flag signal, to generate the loop flag signal.

5. The delay measurement circuit according to claim 4, wherein the loop flag generation circuit further comprises:

a target pulse generation circuit, configured to: count a change edge of the loop flag signal, start to generate a valid pulse of the target pulse signal in response to a 1st change edge of the loop flag signal, finish the valid pulse of the target pulse signal in response to an (M+1)th change edge of the loop flag signal, and generate the measurement finish signal in response to that the valid pulse of the target pulse signal is finished.

6. The delay measurement circuit according to claim 4, wherein the initial flag generation circuit comprises:

a first selector, configured to: receive a frequency representation signal, a first divided clock signal, and a second divided clock signal; select the first divided clock signal and output the first divided clock signal as a timing clock signal when the frequency representation signal indicates that the working frequency of the delay-locked loop is greater than the preset frequency; select the second divided clock signal and output the second divided clock signal as the timing clock signal when the frequency representation signal indicates that the working frequency of the delay-locked loop is less than or equal to the preset frequency, a frequency of the second divided clock signal being higher than a frequency of the first divided clock signal; and A cascaded first flip-flops, configured to: receive the timing clock signal at a clock terminal of each of the first flip-flops, receive the measurement control signal at a data terminal of a first flip-flop at a first stage, a data terminal of each of the first flip-flops after the first stage being connected to an output terminal of a first flip-flop at a previous stage, and output the initial loop flag signal at an output terminal of the first flip-flop at a last stage, A being an integer greater than 1.

7. The delay measurement circuit according to claim 6, further comprising: a frequency divider, configured to: receive a reference clock signal, and perform frequency division processing on the reference clock signal, to generate a plurality of divided clock signals, the plurality of divided clock signals comprising at least the first divided clock signal and the second divided clock signal.

8. The delay measurement circuit according to claim 7, wherein the frequency divider comprises:

a second flip-flop, a clock terminal of the second flip-flop receiving the reference clock signal, and a data terminal of the second flip-flop being connected to an inverting output terminal of the second flip-flop;

a third flip-flop, a clock terminal of the third flip-flop being connected to the output terminal of the second flip-flop, a data terminal of the third flip-flop being connected to an inverting output terminal of the third flip-flop, an output terminal of the third flip-flop outputting the second divided clock signal, and a clock cycle of the second divided clock signal being four times a clock cycle of the reference clock signal; and a fourth flip-flop, a clock terminal of the fourth flip-flop being connected to the output terminal of the third flip-flop, a data terminal of the fourth flip-flop being connected to an inverting output terminal of the fourth flip-flop, an output terminal of the fourth flip-flop outputting the first divided clock signal, and a clock cycle of the first divided clock signal being eight times the clock cycle of the reference clock signal.

9. The delay measurement circuit according to claim 5, wherein the target pulse generation circuit comprises:

a fifth flip-flop, a clock terminal of the fifth flip-flop receiving the loop flag signal, and a data terminal of the fifth flip-flop being connected to an inverting output terminal of the fifth flip-flop;

a sixth flip-flop, a clock terminal of the sixth flip-flop being connected to the output terminal of the fifth flip-flop, a data terminal of the sixth flip-flop being connected to an inverting output terminal of the sixth flip-flop, and the output terminal of the sixth flip-flop outputting the target pulse signal; and a seventh flip-flop, a clock terminal of the seventh flip-flop receiving an inverted signal of the target pulse signal, a data terminal of the seventh flip-flop receiving a power signal, and an output terminal of the seventh flip-flop outputting the measurement finish signal;

M being equal to 4.

10. The delay measurement circuit according to claim 2, wherein the control circuit receives a lock flag signal and the measurement finish signal, generates the measurement control signal of the first level in response to the lock flag signal, and generates the measurement control signal of the second level in response to the measurement finish signal, and the lock flag signal represents that phase locking of the delay-locked loop is completed.

11. The delay measurement circuit according to claim 10, wherein the control circuit comprises:

an eighth flip-flop, a clock terminal of the eighth flip-flop receiving a reference clock signal, a data terminal of the eighth flip-flop receiving the lock flag signal, an output terminal of the eighth flip-flop outputting the measurement control signal, and a reset terminal of the eighth flip-flop receiving the measurement finish signal.

12. The delay measurement circuit according to claim 1, wherein the counter circuit comprises:

a delay adjustment circuit, configured to: receive the divided clock signal, and delay the divided clock signal by first adjustment duration, to generate an adjusted divided clock signal, the first adjustment duration being utilized to match a physical delay required for generating the target pulse signal by the loop flag generation circuit;

a gating circuit, configured to: receive the adjusted divided clock signal and the target pulse signal, and perform gating processing on the adjusted divided clock signal based on the target pulse signal, to generate a counting clock signal; and a binary counter, configured to count a clock pulse of the counting clock signal, to generate a binary timing result.

13. The delay measurement circuit according to claim 12, wherein the preset processing comprises: performing shift processing on the binary timing result based on a frequency of the divided clock signal and a value of M, to obtain the loop delay measurement result.

14. The delay measurement circuit according to claim 3, wherein a difference between a time in which the loop flag signal is cycled for one time in the loop of the delay-locked loop and a time in which the reference clock signal is cycled for one time in the loop of the delay-locked loop is less than a first preset value.

15. A memory, comprising the delay measurement circuit according to claim 1.

* * * * *